(12) United States Patent
Yamamoto et al.

(10) Patent No.: US 6,278,328 B1
(45) Date of Patent: Aug. 21, 2001

(54) POWER AMPLIFIER

(75) Inventors: Kazuya Yamamoto; Akira Inoue; Satoshi Suzuki; Tomoyuki Asada, all of Tokyo (JP)

(73) Assignee: Mitsubishi Denki Kabushiki Kaisha, Toyko (JP)

( * ) Notice: Subject to any disclaimer, the term of this patent is extended or adjusted under 35 U.S.C. 154(b) by 0 days.

(21) Appl. No.: 09/443,372

(22) Filed: Nov. 19, 1999

(30) Foreign Application Priority Data

May 31, 1999 (JP) .................................................. 11-151849

(51) Int. Cl.[7] ....................................................... H02H 7/20
(52) U.S. Cl. ....................... 330/298; 330/310; 330/207 P
(58) Field of Search ............................... 330/98, 133, 134, 330/207 P, 298, 310, 99, 100, 110

(56) References Cited

U.S. PATENT DOCUMENTS 3,098,199 * 7/1963 Carney et al. ........................... 330/29
4,232,272 * 11/1980 Fabri ..................................... 330/294
5,982,236 * 11/1999 Ishikawa et al. ..................... 330/296

* cited by examiner

*Primary Examiner*—Robert Pascal
*Assistant Examiner*—Henry Choe
(74) *Attorney, Agent, or Firm*—Leydig, Voit & Mayer, Ltd.

(57) ABSTRACT

While minimizing any increase in chip size and without incurring a loss in performance or operating characteristic under normal operating voltage conditions, a power amplifier protection circuit effectively prevents breakdown of power amplifying transistors resulting from output load fluctuations during operation with an overvoltage supply. The protection circuit includes a gate circuit electrically connected between the collector and base of at least the last-stage transistor in a power amplifier including transistors connected in stages. The gate circuit passes a feedback current to the base electrode of the protected transistor when a voltage exceeding a specific level is applied to the collector of the protected transistor.

14 Claims, 8 Drawing Sheets

POWER AMPLIFIER

BACKGROUND OF THE INVENTION

1. Field of the Invention

The present invention relates to a protection circuit for preventing transistor breakdown during overvoltage output operation in a power amplifier having a GaAs heterojunction bipolar transistor (HBT) a Si bipolar transistor.

2. Description of Related Art

Monolithic microwave integrated circuits (MMIC) and modules (hybrid ICs and multichip modules) using GaAs metal-semiconductor field effect transistors (MESFET), GaAs high electron mobility transistors (HEMT), or GaAs-based HBTs are widely used in power amplifiers for mobile communications devices. Of these, GaAs-based HBTs offer the following three advantages over conventional FETs, and are therefore considered promising as power module elements for future mobile communication devices. That is, a GaAs-based HBT:

1) does not require a negative gate bias voltage, and can therefore be used for simple power supply operations;
2) can be used for on/off operations without an analog switch on the drain side, similarly to a Si-MOSFET;
3) has a high output power density, enabling a particular rated output power to be achieved from a device that is smaller than a FET power amplifier with comparable output power.

HBT power amplifiers using these particular properties of HBTs are starting to be used in 2 W to 4 W high output mobile telephones conforming to Europe's GSM (Global System for Mobile Communications) standard, a 900 MHz system that is the most widely used mobile telephone service in Europe.

FIG. 10 is a typical circuit diagram for an HBT power amplifier 500 used in a GSM mobile telephone. Referring to FIG. 10, input terminal 501 is the input terminal for RF signals to be power amplified. Output terminal 502 is the output terminal for amplified signals. Transistors 503 to 505 are heterojunction bipolar transistors for signal amplifying. Transistors 506 to 511 are bias HBTs. Terminals 512 to 514 are terminals for applying collector bias voltages Vc1 to Vc3. Terminal 515 is the supply terminal for the power supply voltage Vcc. Terminal 516 is the supply terminal for power control voltage Vpc for controlling the base voltage of amplifying transistors 503 to 505 using bias transistors 506 to 511. As shown in the figure, this HBT power amplifier 500 also comprises resistors 517 to 542, capacitors 543 to 552, and microwave lines 553 to 557.

A typical HBT power amplifier has a high low-frequency gain and is more susceptible to low frequency oscillation than an FET power amplifier. To prevent this low frequency oscillation, HBT power amplifier 500 has an RC feedback circuit comprising resistor 521 and capacitor 544 disposed between the collector and base of transistor 503; an RC feedback circuit comprising resistor 525 and capacitor 545 disposed between the collector and base of transistor 504; and an RC feedback circuit comprising resistor 529 and capacitor 548 disposed between the collector and base of transistor 505.

A current of approximately 2 A flows to circuits in a mobile telephone based on the GSM standard. A means such as a regulator or cut-off circuit that operates when an overvoltage is applied could be provided between the power terminal and battery as a means of protecting transistors in the HBT power amplifier 500. However, such cut-off circuits and regulators are typically large-scale, high power consumption devices. It is therefore not possible to dispose a cut-off circuit or regulator between the battery and supply terminal of the HBT power amplifier 500, and the supply terminal is directly connected to an internal battery.

It is also desirable to provide an isolator between the output terminal of the HBT power amplifier 500 and a downstream circuit (such as an antenna). This isolator is used for suppressing variations in the load curve of HBT power amplifier 500 when the load impedance of a downstream circuit varies. This isolator, however, is typically comparable to the chip size of the HBT power amplifier 500, and is therefore omitted in GSM standard mobile telephones because of the high demand for smaller mobile telephones.

If the supply voltage rises to a particular level above the recommended operating conditions (3 V to 3.6 V) during battery recharging, for example, rises to 4.5 V to 5.5 V, and the load impedance of downstream circuits varies greatly from the normal 50 Ω level, the load characteristic curve of the last transistor 505 in a HBT power amplifier 500 for GSM devices described as noted above may fluctuate excessively, causing the peak collector voltage Vce to exceed the breakdown voltage and transistor 505 to fail.

The last transistor 505 can fail as a result of load fluctuations during battery charging as described below, but failure can also result from an overvoltage being applied to the collector of the last transistor 505.

It should also be noted that a feedback circuit 600 having a diode 604 as shown in FIG. 11 has also been used to resolve the above-noted problems relating to an overvoltage supply in applications other than mobile telephones and other mobile devices, particularly in the field of optical communications. The feedback circuit 600 shown in FIG. 11 is used primarily in the signal amplifier 601 disposed in the front end of an optical communications receiver. When an overvoltage supply is input the diode 604 becomes conductive, thereby reducing the power applied to the signal input terminal 602 of the signal amplifier 601 to prevent signal amplifier 601 failure, wave distortion, and overload output.

High output power amplifiers producing 1 W or more are used in GSM standard mobile telephones. Providing a feedback circuit 600 as described above to the input/output terminals of such a high output power amplifier, however, cannot effectively protect the internal transistors of the power amplifier, and in particular cannot protect the last transistor 505. This is because failure and thermal damage to transistors inside the amplifier is due not primarily to an overvoltage supply being input to the amplifier, but is due to the peak collector voltage Vce exceeding the breakdown voltage due to load fluctuations during overloaded operation of transistors in the amplifier.

The load fluctuation characteristic during overload operation of the transistors when a tuner 560 produces a variable load impedance at the output terminal 502 of the HBT power amplifier 500 is considered next below. FIG. 12 shows the second and third stage circuits of a HBT power amplifier 500 to which this tuner 560 is connected.

FIG. 13 shows the load curve and Ic-Vce curve of the last transistor 505 when tuner 560 is connected. Point A1 on the graph indicates the normal collector bias voltage $V_{c3-1}$ (typically 3.2 V) applied to terminal 514 when the base current is $I_{b2}$. Curve c1 is the load curve when the load impedance of the tuner 560 is normal (that is, 50 Ω) and the voltage standing wave ratio (VSWR) is 1:1. Curve c2 is the load curve when there is a mismatch, that is, the load impedance deviates from the normal impedance (50 Ω in this case) and the VSWR is 8:1 to 10:1. Such a mismatch occurs when, for example, a mobile telephone comprising this HBT power amplifier 500 passes a highly conductive object, such as a steel utility pole.

As will be known from comparing curves c1 and c2, if the standing wave ratio of the output terminal is increased and the output mismatch is increased, load curve fluctuation will increase and the peak collector voltage Vce will approach the transistor breakdown voltage area 1 indicated by a circle line in the figure.

FIG. 14 shows the load curve and Ic-Vce curve of the last transistor 505 when the collector bias voltage applied to terminal 514 is a voltage $V_{c3-2}$ (5.0 V in this example) higher than $V_{c3-1}$ (3.2 V as noted above). Point A2 on the graph indicates the collector bias voltage $V_{c3-2}$ applied to terminal 514 when the base current is $I_{b2}$. As is curve c1 in FIG. 13, curve c3 is the load curve when the load impedance of the tuner 560 is normal (that is, 50 Ω) and the voltage standing wave ratio (VSWR) is 1:1. As is curve c2 in FIG. 13, curve c4 is the load curve when there is a mismatch, that is, the load impedance deviates from the normal impedance (50 Ω in this case) and the VSWR is 8:1 to 10:1. As will be known from curve c2 in FIG. 13 and curve c4 in FIG. 14, the peak collector voltage Vce exceeds the breakdown voltage (enters breakdown area 1 in the figures) and increases the potential for transistor breakdown when the collector bias voltage exceeds a particular level.

When current gain is improved and parasitic resistance and capacitance are reduced to improve transistor characteristics during low voltage operation, that is, operation at the standard operating voltage of 3 V to 3.6 V in mobile telephones designed for low voltage operation, the breakdown voltage also tends to drop. Due to the potential for supply voltage variations and load variations, it is therefore desirable to provide an isolator for suppressing variations in the load curve due to fluctuations in the load impedance of downstream circuits. In systems such as GSM standard mobile telephones in which such an isolator is not provided because of the demand for compact size, it is therefore important to prevent transistor breakdown caused by overload output of the collector voltage Vce resulting from load fluctuations during overload operation of amplifier transistors.

SUMMARY OF THE INVENTION

With consideration for the above described problems, an object of the present invention is to provide a protection circuit for a power amplifier for effectively preventing breakdown of power amplification transistors caused by output load variations during overvoltage operation, without incurring any deterioration in operating characteristics under normal voltage conditions and at the same time suppressing an increase in chip size.

To achieve the above object, a protection circuit for a power amplifier includes a plurality of transistors connected in a multiple stage for forming the power amplifier; and a gate circuit connected between a collector and base of at least a last-stage transistor of said plurality of transistors. The gate circuit supplies a feedback current to the base of said last-stage transistor when a voltage of a specific level or greater is applied to said collector of said last-stage transistor.

A protection circuit thus comprised functions as a feedback circuit for suppressing the voltage applied to the collector electrode when a voltage exceeding a specified level is applied to the last-stage transistor, that is, the transistor being protected by the protection circuit, in the power amplifier. By way of the circuit design and without improving the device characteristics of the transistor itself, it is therefore possible to keep the peak collector voltage Vce of the last-stage transistor in the power amplifier from exceeding the breakdown voltage, and thus prevent amplifier failure, as a result of operation with an overvoltage supply or a mismatched output load.

The gate circuit preferably includes a transistor of which collector and base are mutually connected. In this case, the transistor of the gate circuit further preferably forms a Vbe multiplier together with a first and second resistors. The first resistor is connected between the collector and base of the transistor and second resistor is connected between the base and emitter of the transistor.

The gate circuit can alternatively have a plurality of transistors diode connected in series, each transistor having its base connected to its collector. This design further reduces parasitic capacitance, and can thus reduce the effects of parasitic capacitance on the amplification ratio and output signal wave under normal operating voltage conditions. Further preferably in this case, at least one of the plurality of transistors in the gate circuit forms a Vbe multiplier together with a first and second resistors. The first resistor is connected between the collector, and the second resistor is connected between the base and emitter of at least one of the plurality of transistors.

In addition, a specific resistance connected to the collector or emitter of the transistor forming the Vbe multiplier. Alternatively, one or more transistors diode-connected in series to the collector or emitter of the transistor forming said Vbe multiplier.

Further alternatively, a collector electrode at one end of the gate circuit is connected to a collector electrode of the protected transistor, and a base electrode at another end of the gate circuit is connected to a base electrode of the protected transistor. It is therefore possible by means of the circuit design and not by improving the device characteristics of the transistors to prevent the peak collector voltage Vce of the last-stage transistor in the power amplifier from exceeding the breakdown voltage due to operation with an overvoltage supply input or mismatched output load. Amplifier failure can therefore also be prevented.

Yet further alternatively, the base electrode at another end of the gate circuit may be connected to a base electrode of the protected transistor through an intervening coupling capacitance to a transistor in a preceding stage. In this case feedback current can be supplied from the collector electrode to the base electrode of the protected transistor when the voltage between the collector and base of the protected transistor is higher than a specific level at which the protection circuit passes feedback current and lower than the breakdown voltage of the protected transistor.

When a protection circuit according to the present invention is used in a power amplifier for GSM devices, current feedback from the protection circuit can be interrupted and the collector current Ic controlled reliably to 0 V when the bias voltage applied to the base electrode of each transistor in the power amplifier is 0 V even if the voltage applied to the collector electrode exceeds a specified level.

It is also possible by means of the circuit design and not by improving the device characteristics of the transistors to prevent the peak collector voltage Vce of the last-stage transistor in the power amplifier from exceeding the breakdown voltage due to operation with an overvoltage supply input or mismatched output load. Amplifier failure can therefore also be prevented.

Other objects and attainments together with a fuller understanding of the invention will become apparent and appreciated by referring to the following description and claims taken in conjunction with the accompanying drawings.

BRIEF DESCRIPTION OF THE DRAWINGS

The present invention will become readily understood from the following description of preferred embodiments thereof made with reference to the accompanying drawings, in which like parts are designated by like reference numeral and in which.

DESCRIPTION OF THE PREFERRED EMBODIMENTS

A power amplifier protection circuit according to the present invention is designed to protect at least the last-stage transistor of a power amplifier comprising a plurality of transistors connected in multiple amplifying stages. This protection circuit comprises a gate circuit connected between the collector and base electrodes of the protected transistor for supplying a feedback current to the base electrode when a voltage exceeding a specified level is applied to the collector electrode.

A Vbe multiplier is an exemplary gate circuit for this protection circuit. When thus comprised it is possible to prevent, by way of the circuit design and without improving the device characteristics of the transistor itself, the peak collector voltage Vce of the last-stage transistor in the power amplifier from exceeding the breakdown voltage, and thus prevent amplifier failure, as a result of operation with an overvoltage supply or a mismatched output load.

EMBODIMENT 1

Figure 1:
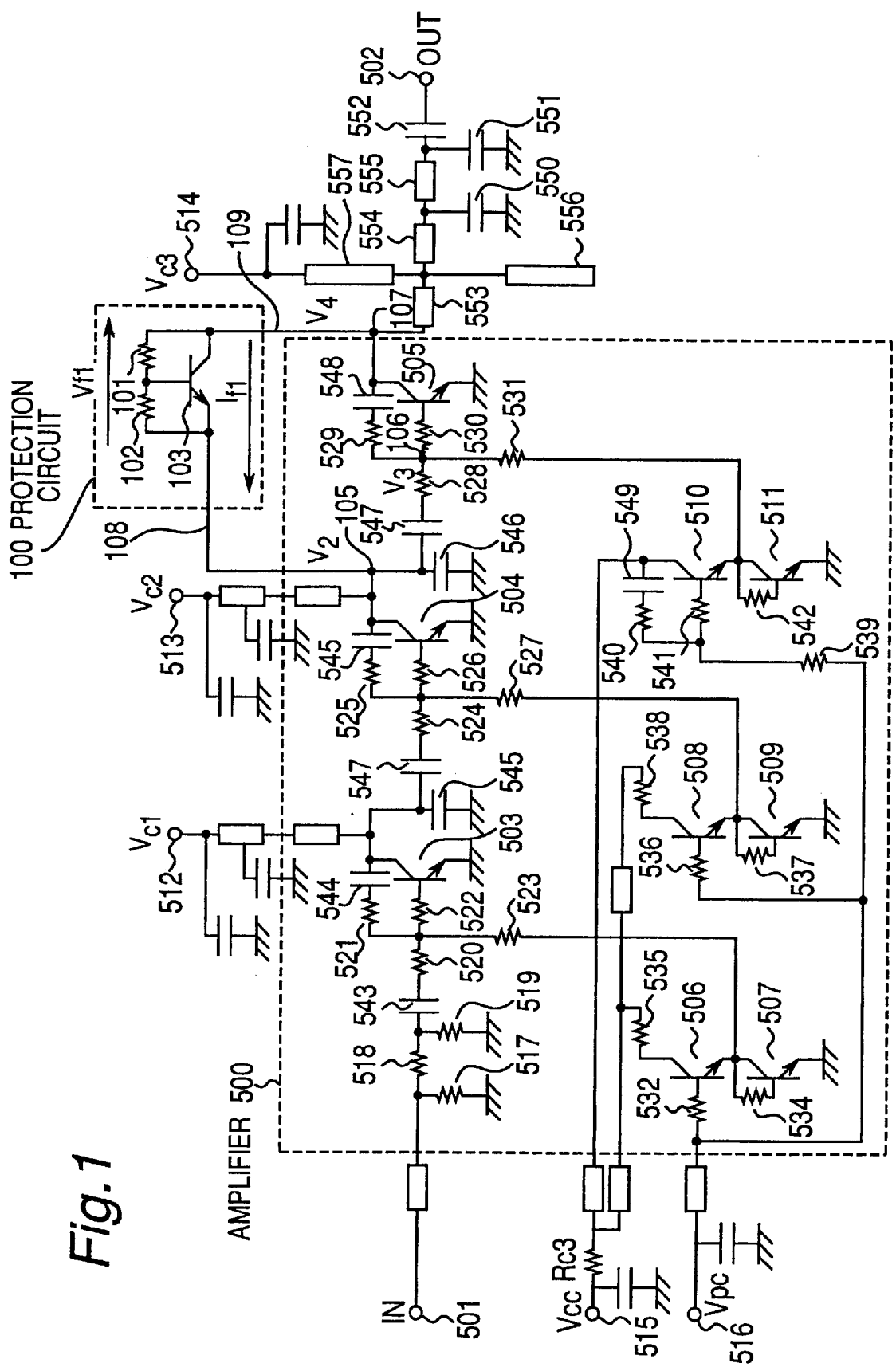
FIG. 1 is a typical circuit diagram of a protection circuit according to a first embodiment of the present invention, and an amplifier to which the protection circuit is combined.

FIG. 1 is a typical circuit diagram of a protection circuit 100 according to this first preferred embodiment of the present invention, and a GSM-standard HBT power amplifier 500 in which this protection circuit 100 is connected.

This protection circuit 100 is a so-called Vbe multiplier, and comprises resistors 101 and 102, and transistor 103. Transistor 103 is a heterojunction bipolar transistor (HBT). One end of resistor 101 is connected to the collector, and the other end is connected to the base, of transistor 103. One end of resistor 102 is connected to the base, and the other end is connected to the emitter, of transistor 103. In addition to resistor 101, the collector of transistor 103 is also connected to terminal 109. In addition to resistor 102, the emitter of transistor 103 is also connected to terminal 108.

The HBT power amplifier 500 is a common power amplifier used in GSM devices, and is identical to the HBT power amplifier 500 described under the discussion of related art above. As described above, input terminal 501 is the input terminal for RF signals to be power amplified. Output terminal 502 is the output terminal for amplified signals. Transistors 503 to 505 are heterojunction bipolar transistors for signal amplifying. Transistors 506 to 511 are bias HBTs. Terminals 512 to 514 are terminals for applying collector bias voltages Vc1 to Vc3. Terminal 515 is the supply terminal for the power supply voltage Vcc. Terminal 516 is the supply terminal for power control voltage Vpc for controlling the base voltage of amplifying transistors 503 to 505 using bias transistors 506 to 511. As shown in the figure, this HBT power amplifier 500 also comprises resistors 517 to 542, capacitors 543 to 552, and microwave lines 553 to 557.

The potential V2 at node 105 in FIG. 1 represents the collector voltage of transistor 504. The potential V3 at node 106 represents the base voltage of transistor 505. Potential V4 at node 107 represents the collector voltage of last transistor 505. Current If1 is the current flowing to this protection circuit 100, and potential Vf1 is the potential difference (=V4−V2) between nodes 105 and 107 in FIG. 1.

One terminal 108 of the protection circuit 100 is connected to node 105, and the other terminal 109 is connected to node 107. In conjunction with the AC coupling capacitance 547 of last transistor 505, protection circuit 100 thus forms a feedback circuit for last transistor 505.

It is to be noted that terminal 108 of protection circuit 100 is not directly connected to the base of last transistor 505 through intervening AC coupling capacitance 547 for the following reason.

That is, the collector current Ic1 to Ic3 of transistors 503, 504, and 505, and supply current Icc, must be 0 A when the power control voltage Vpc applied to terminal 516 is 0 V in a power amplifier 500 for GSM devices. However, if terminal 108 of protection circuit 100 is connected directly to the base electrode by being connected at node 106, instead of being connected to the base electrode through AC coupling capacitance 547, the collector current Ic3 will not go to 0 A even if the power control voltage Vpc is set to 0 V when collector bias voltage Vc3 is high and protection circuit 100 is functioning as a feedback circuit. Therefore, to control collector current Ic3 to 0 A regardless of the collector bias voltage Vc3, when the power control voltage Vpc is 0 V, terminal 108 of protection circuit 100 is connected to node 105, and thus connected to the base electrode of last transistor 505 with AC coupling capacitor 547 disposed therebetween.

It will be obvious to one with ordinary skill in the related art that terminal 108 of the protection circuit 100 can be directly connected to the base electrode of the last-stage transistor, and terminal 109 can be connected to the collector electrode, if the protection circuit 100 is used in an amplifier for non-GSM applications and it is not necessary to control the collector current Ic of each transistor to 0 A in response to a specific control signal. This is also true with respect to the protection circuits 130, 140, 150, 160, 170, and 180 described below as the second to seventh preferred embodiments of the present invention.

In a protection circuit 100 thus comprised, the on voltage of transistor 103 is typically approximately 1.3 V. If the resistance of resistor 101 is $R_{fb1}$ and the resistance of resistor 102 is $R_{fb2}$, transistor 103 switches on and the protection circuit 100 passes feedback current $I_{f1}$ from node 107 to node 105 when the voltage $V_{f1}$ between terminals 108 and 109 is $(R_{fb1}+R_{fb2})/R_{fb2} \times 1.3$ (V) or greater.

It is to be noted that the voltage at which the protection circuit 100 begins to function as a feedback circuit is referred to herein as the on voltage.

This on voltage is higher than the normal collector bias voltage Vc3 supplied to terminal 514 but lower than the breakdown voltage of last transistor 505. This is also true with respect to the protection circuits 130, 140, 150, 160, 170, and 180 described below as the second to seventh preferred embodiments of the present invention.

Figure 2A:
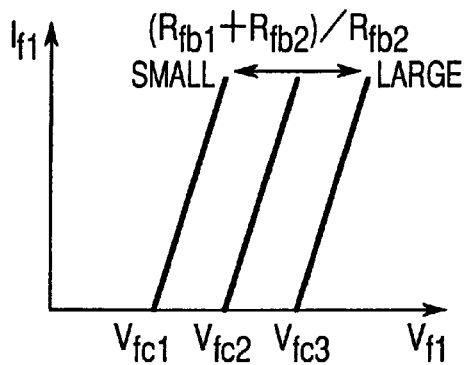
FIG. 2A is a graph showing the change in the on supply accompanying a change in the resistance of the protection circuit.
Figure 2B:
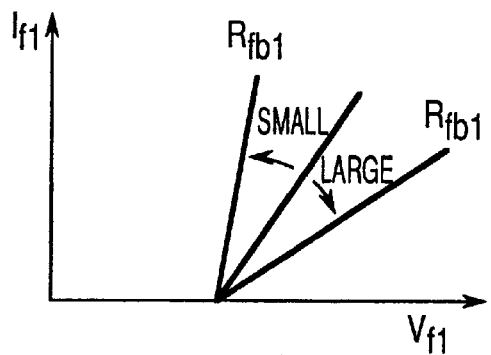
FIG. 2B is a graph showing the change in the on resistance accompanying a change in the resistance of the protection circuit.

FIG. 2A and FIG. 2B show the operating characteristic of protection circuit 100. FIG. 2A shows the $V_{f1}-I_{f1}$ curve when $(R_{fb1}+R_{fb2})/R_{fb2}$ is varied. FIG. 2B shows the $V_{f1}-I_{f1}$ curve when resistance $R_{fb1}$ of resistor 101 is varied.

As shown in FIG. 2A, the on voltage of the Vbe multiplier can be changed as indicated by Vcf1 to Vcf3 when $(R_{fb1}+R_{fb2})/R_{fb2}$ is varied. As shown in FIG. 2B, the resistance (referred to below as the on resistance) of the protection circuit 100 when operated as a feedback circuit can be changed by holding $(R_{fb1}+R_{fb2})/R_{fb2}$ constant and varying resistance $R_{fb1}$ of resistor 101.

Figure 3:
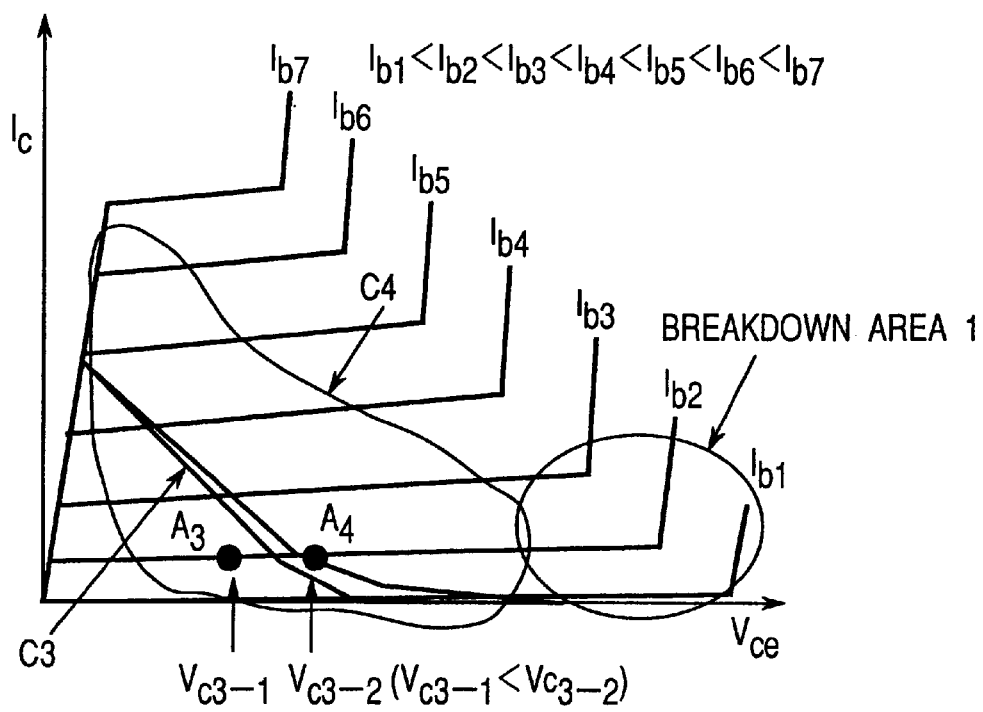
FIG. 3 is a graph showing the load curve and transistor Ic-Vce characteristic when the load impedance of a circuit connected to the output terminal of an amplifier comprising this protection circuit is changed.

FIG. 3 shows the load curve and Ic-Vce characteristic of last transistor 505 when the load impedance of a circuit connected to the output terminal 502 of HBT power amplifier 500 comprising a protection circuit 100 according to this preferred embodiment is varied. Point A3 on the graph indicates the normal collector bias voltage $V_{c3-1}$ (typically 3.2 V) applied to terminal 514 when the base current is $I_{b2}$. Point A4 on the graph indicates an exemplary 5-V collector bias voltage $V_{c3-2}$ applied to terminal 514 when the base current is $I_{b2}$.

Curve c3 is the load curve when bias voltage $V_{c3-2}$ is applied, the load impedance of the circuit connected to output terminal 502 is normal (that is, 50 Ω), and the voltage standing wave ratio (VSWR) is 1:1. Curve c4 is the load curve when bias voltage $V_{c3-2}$ is applied, and the load impedance of the circuit connected to output terminal 502 deviates from the normal impedance (50 Ω in this case), resulting in a mismatch with a VSWR of 8:1 to 10:1.

As will be understood from curve C4, the peak collector voltage Vce does not rise to the breakdown level as indicated by area 1 in FIG. 3 when the collector bias voltage rises from the normal $V_{c3-1}$ (=3.2 V) voltage to $V_{c3-2}$ (=5.0 V).

As a result, even if the load impedance of a downstream-connected circuit (not shown in the figures) varies when the collector bias voltage applied to terminal 514 of last transistor 505 has risen from the normal $V_{c3-1}$ (=3.2 V) voltage to $V_{c3-2}$ (=5.0 V) during battery charging, for example, the protection circuit 100 will operate to suppress an increase in the collector voltage, variation in the load curve will be suppressed, and the peak collector voltage Vce can be prevented from reaching the breakdown level.

In addition, there is substantially no drop in the amplification ratio or output characteristic compared with when the protection circuit is not loaded because the added protection circuit 100 does not operate as a feedback circuit during operation at the normal operating voltage $V_{c3-1}$ (=3.2 V).

As described above, a protection circuit 100 according to this preferred embodiment can effectively prevent breakdown of the last transistor 505 during operation under overvoltage supply conditions or mismatched output load conditions without sacrificing performance during normal 3V low voltage supply conditions, that is, operation with a normal operating voltage.

In addition, the added protection circuit 100 is used primarily as an active element and occupies little area. As a result, an increase in chip size as a result of adding this protection circuit 100 can be suppressed as much as possible.

It is also possible as described above to provide an isolator for suppressing fluctuation in the load curve of the last transistor 505 in the power amplifier 500 as a result of variation in the load impedance of a circuit connected to the output terminal 502 of the power amplifier 500. Such an isolator, however, also greatly increases the overall chip size as described above. By using a protection circuit 100 according to this preferred embodiment of the invention, however, it is possible to prevent breakdown of this last transistor 505 while also significantly reducing the overall circuit scale compared with use of the above-noted isolator.

EMBODIMENT 2

Figure 4:
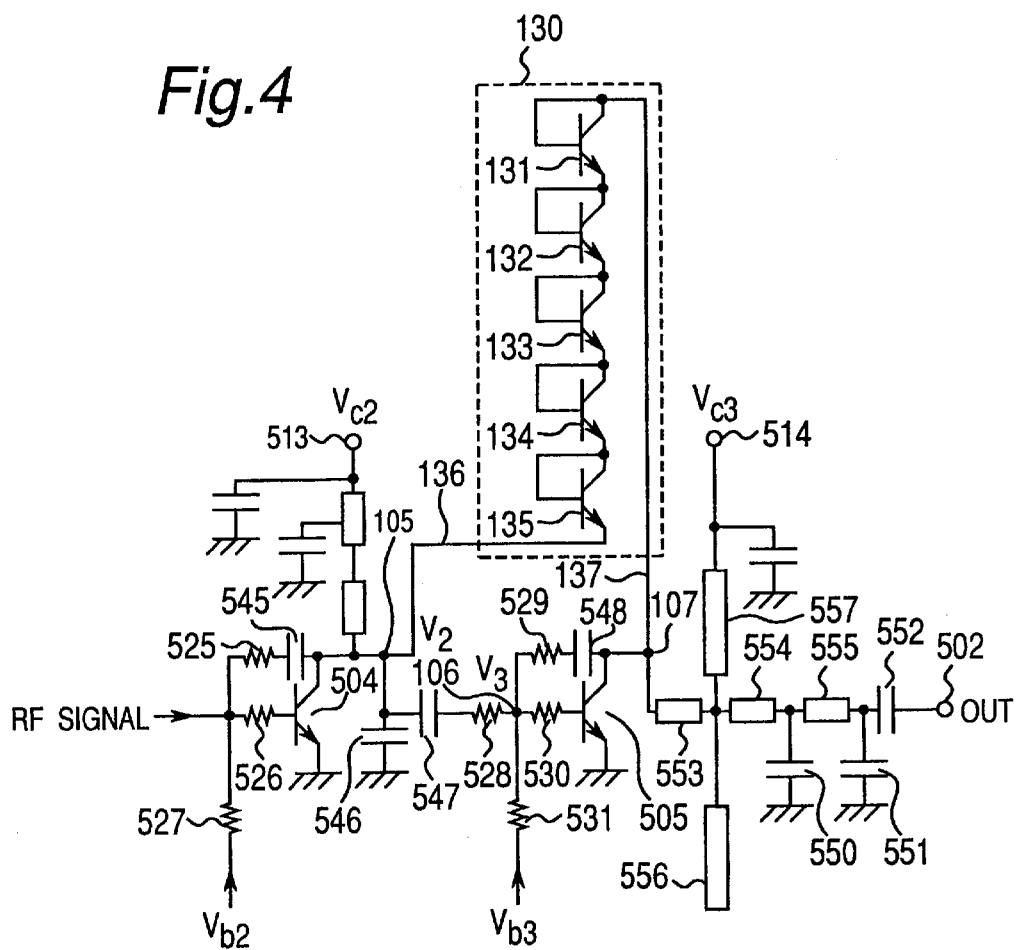
FIG. 4, FIG. 5, FIG. 6, FIG. 7, FIG. 8 and FIG. 9 are circuit diagrams of protection circuits according to second through ninth embodiments of the present invention, and amplifiers comprising said protection circuits.

FIG. 4 is a circuit diagram of a protection circuit 130 according to a second preferred embodiment of the present invention used in the above-described power amplifier 500. Note that FIG. 4 shows only the significant circuit elements in the area of the second and third stage transistors 504 and 505 in power amplifier 500.

This protection circuit 130 comprises five transistors 131 to 135 diode connected in series with the collector of each transistor shorted to the base. The collector of transistor 131 is connected to terminal 137. This terminal 137 is connected to node 107 of power amplifier 500. The emitter of transistor 131 is connected to the collector of transistor 132. The emitter of transistor 132 is connected to the collector of transistor 133. The emitter of transistor 133 is connected to the collector of transistor 134. The emitter of transistor 134 is connected to the collector of transistor 135. The emitter of transistor 135 is connected to terminal 136, and terminal 136 is connected to node 105 of power amplifier 500.

The on voltage and on resistance of this protection circuit 130 are determined by the number of connected transistors. For example, if the on voltage of transistors 131 to 135 is 1.3 V, the on voltage of the protection circuit 130 is 1.3×5=6.5 V. If the internal resistance of transistor 131 is R131, the on resistance is R131×5 Ω.

It is to be noted that the equivalent effect can be achieved by using one or two to four transistors with a high on voltage in place of transistors 131 to 135 each having an on voltage of 1.3 V. In addition, one or more of these transistors 131 to 135 can be replaced by a protection circuit 100 according to the above first preferred embodiment of the present invention, or any of the alternative protection circuits 140, 150, 160, or 170 according to the third to sixth embodiments described below.

As achieved with a protection circuit 100 according to the first preferred embodiment of the present invention, it is possible by adding this protection circuit 130 to the last transistor 505 to effectively prevent breakdown of the last transistor 505 during operation under overvoltage supply conditions or mismatched output load conditions without sacrificing performance during normal 3-V low voltage supply conditions, that is, operation with a normal operating voltage.

By diode connecting a plurality of transistors 131 to 135 in series in this protection circuit 130, parasitic capacitance can be reduced compared with a protection circuit 100 according to the first embodiment, and the effect of parasitic capacitance on amplification ratio and output signals during normal voltage operation can be reduced.

It will also be obvious that the chip area occupied by this protection circuit 130 is greater than the area occupied by protection circuit 100 because of the serial diode connection of a plurality of transistors. However, compared with the use of an isolator to prevent last transistor 505 breakdown as previously described above, it is still possible by means of this protection circuit 130 to prevent breakdown of this last transistor 505 while also significantly reducing the overall circuit scale compared with use of the above-noted isolator.

EMBODIMENT 3

Figure 5:
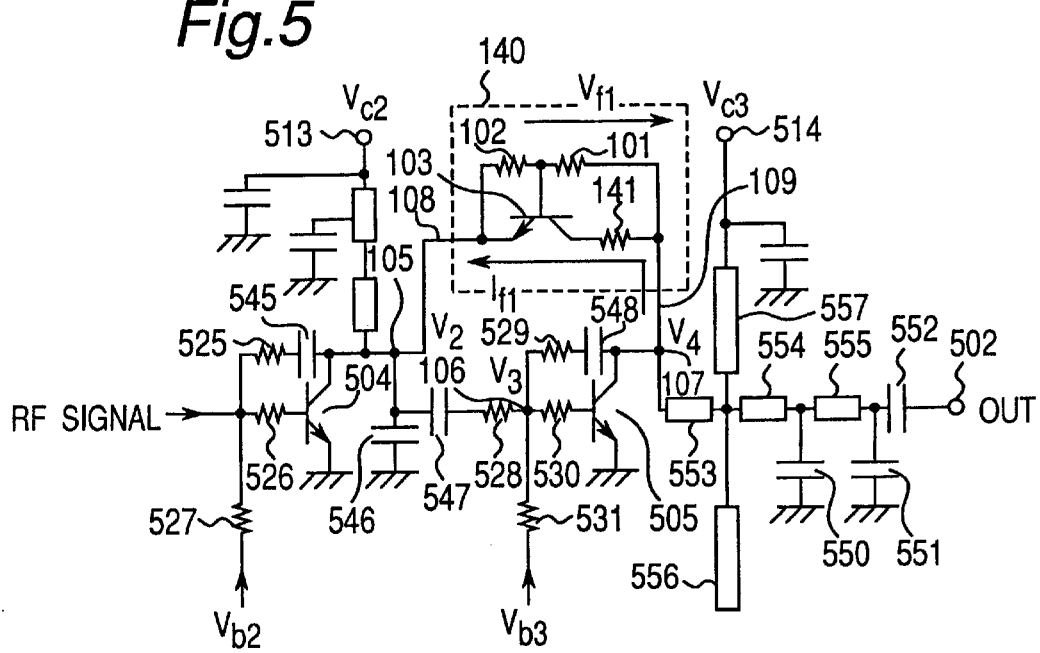

FIG. 5 is a circuit diagram of a protection circuit 140 according to a third preferred embodiment of the present invention used in the above-described power amplifier 500. Note that FIG. 5 shows only the significant circuit elements in the area of the second and third stage transistors 504 and 505 in power amplifier 500.

As will be known from FIG. 5, this protection circuit 140 is substantially protection circuit 100 according to the first embodiment, further comprising a resistor 141 connected to the collector of transistor 103. Note that like parts in protection circuit 100 and this protection circuit 140 are identified by like reference numerals.

The on voltage of the protection circuit 140 thus comprised is $(R_{fb1}+R_{fb2})/R_{fb2} \times 1.3$ (V). The on resistance can be adjusted by controlling resistance $R_{fb1}$ of resistor 101 and $R_{fc1}$ of resistor 141. It is therefore possible to more precisely control the feedback current. Other effects and achievements of this embodiment are the same as those of the first embodiment.

EMBODIMENT 4

Figure 6:
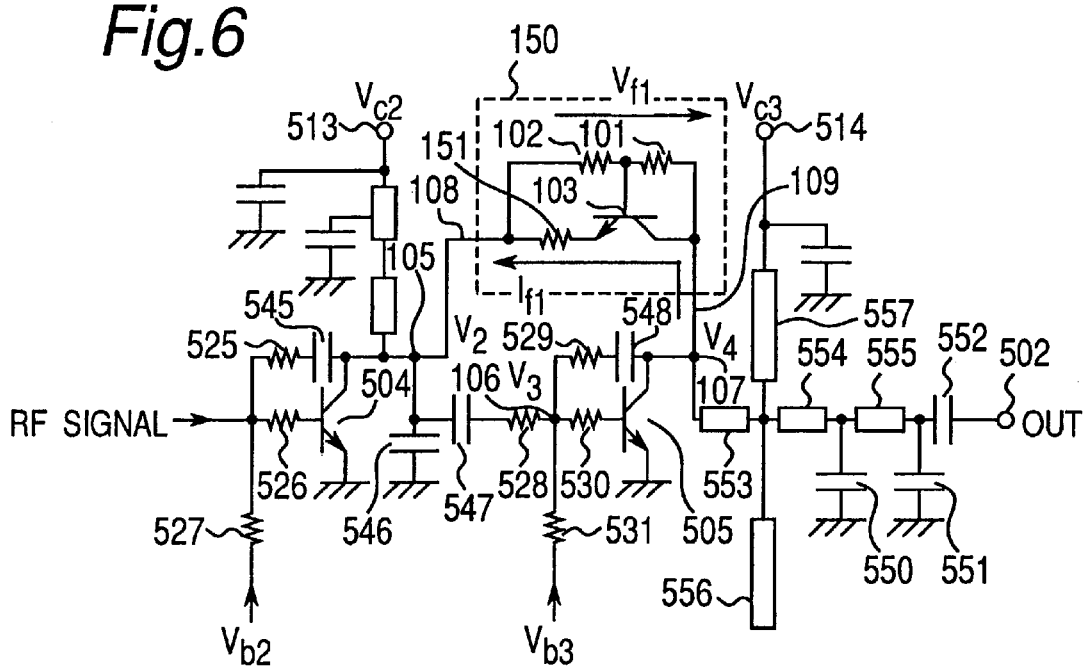

FIG. 6 is a circuit diagram of a protection circuit 150 according to a fourth preferred embodiment of the present invention used in the above-described power amplifier 500. Note that FIG. 6 shows only the significant circuit elements in the area of the second and third stage transistors 504 and 505 in power amplifier 500.

As will be known from FIG. 6, this protection circuit 150 is substantially protection circuit 100 according to the first embodiment, further comprising a resistor 151 connected to the emitter of transistor 103. Note that like parts in protection circuit 100 and this protection circuit 150 are identified by like reference numerals.

The on voltage of a protection circuit 150 thus comprised is $(R_{fb1}+R_{fb2})/R_{fb2} \times 1.3$ (V). As with a protection circuit 140 according to the above third embodiment of the invention, the on resistance of this protection circuit 150 can be adjusted by controlling resistance $R_{fb1}$ of resistor 101 and $R_{fe1}$ of resistor 151. It is therefore possible to more precisely control the feedback current. Other effects and achievements of this embodiment are the same as those of the first embodiment.

EMBODIMENT 5

Figure 7:
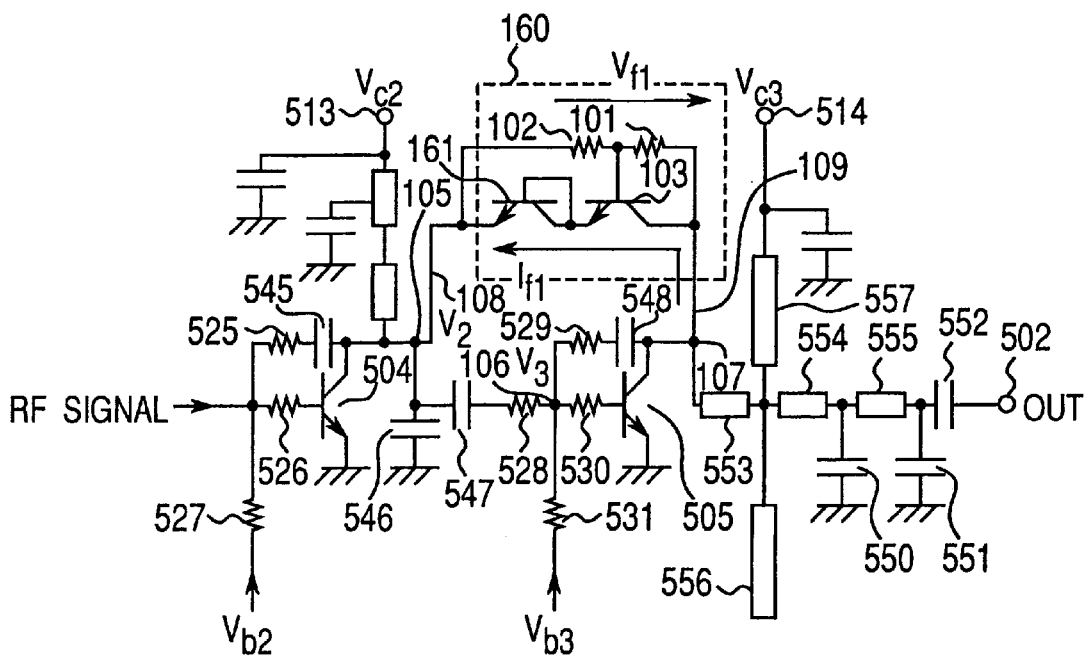

FIG. 7 is a circuit diagram of a protection circuit 160 according to a fifth preferred embodiment of the present invention used in the above-described power amplifier 500. Note that FIG. 7 shows only the significant circuit elements in the area of the second and third stage transistors 504 and 505 in power amplifier 500.

As will be known from FIG. 7, this protection circuit 160 is substantially protection circuit 100 according to the first embodiment, further comprising a transistor 161 diode connected to the emitter of transistor 103. Note that like parts in protection circuit 100 and this protection circuit 160 are identified by like reference numerals.

The on voltage of a protection circuit 160 thus comprised is $(R_{fb1}+R_{fb2})/R_{fb2} \times 2.6$ (V). The on resistance of this protection circuit 160 can be adjusted by controlling resistance $R_{fb1}$ of resistor 101 and resistance $R_{161}$, which is determined by the size of transistor 161. It is to be noted that transistor 161 can be alternatively connected to the collector of transistor 103.

As will be known from FIG. 7, the protection circuit 160 according to this preferred embodiment has one more transistor connected in series than does the protection circuit 100 shown in FIG. 1. This protection circuit 160 can therefore further reduce the parasitic capacitance component compared with protection circuit 100, and can thus further reduce the effects of parasitic capacitance on the amplification ratio and output signal wave under normal operating voltage conditions.

Other effects and achievements of this embodiment are the same as those of the first embodiment.

EMBODIMENT 6

Figure 8:
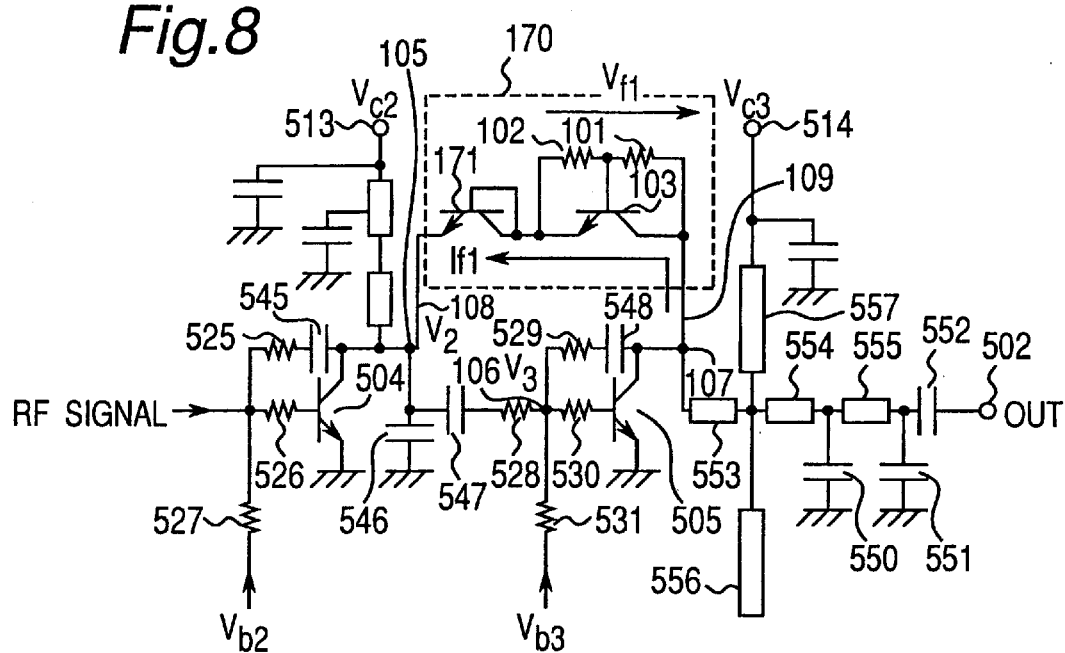

FIG. 8 is a circuit diagram of a protection circuit 170 according to a sixth preferred embodiment of the present invention used in the above-described power amplifier 500. Note that FIG. 8 shows only the significant circuit elements in the area of the second and third stage transistors 504 and 505 in power amplifier 500.

As will be known from FIG. 8, this protection circuit 170 is substantially protection circuit 100 according to the first embodiment, further comprising a transistor 171 diode connected in series with the last stage of protection circuit 100. Note that like parts in protection circuit 100 and this protection circuit 170 are identified by like reference numerals.

The on voltage of a protection circuit 170 thus comprised is $(R_{fb1}+R_{fb2})/R_{fb2} \times 1.3$ (V). The on resistance of this protection circuit 170 can be adjusted by controlling resistance $R_{fb1}$ of resistor 101 and $R_{171}$, which is determined by the size of the added transistor 171. It is to be noted that transistor 171 can be alternatively connected in series before the first stage of a protection circuit 100 according to the first embodiment.

As with a protection circuit 160 according to the above sixth embodiment, this protection circuit 170 increases the number of transistors to two. This protection circuit 170 can therefore further reduce parasitic capacitance compared with protection circuit 100, and can thus further reduce the effects of parasitic capacitance on the amplification ratio and output signal wave under normal operating voltage conditions.

Other effects and achievements of this embodiment are the same as those of the first embodiment.

EMBODIMENT 7

Figure 9:
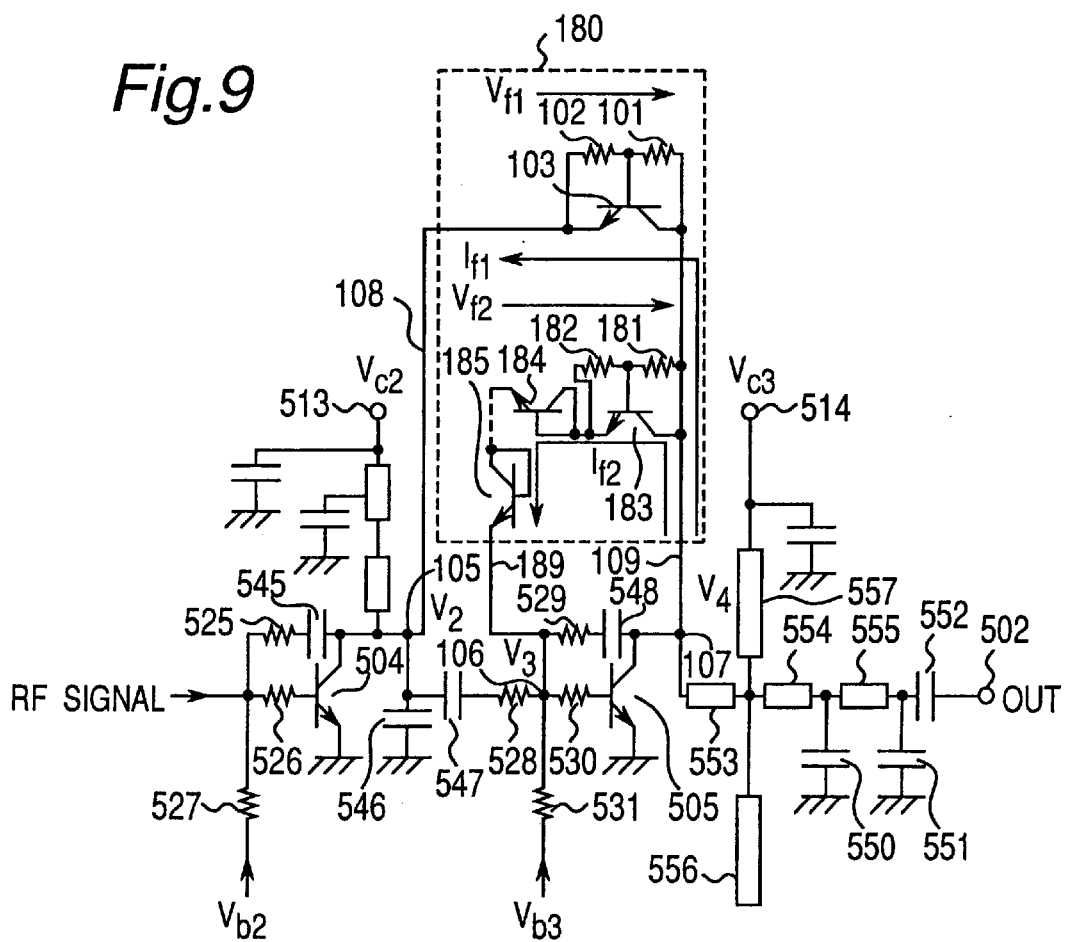
Figure 10:
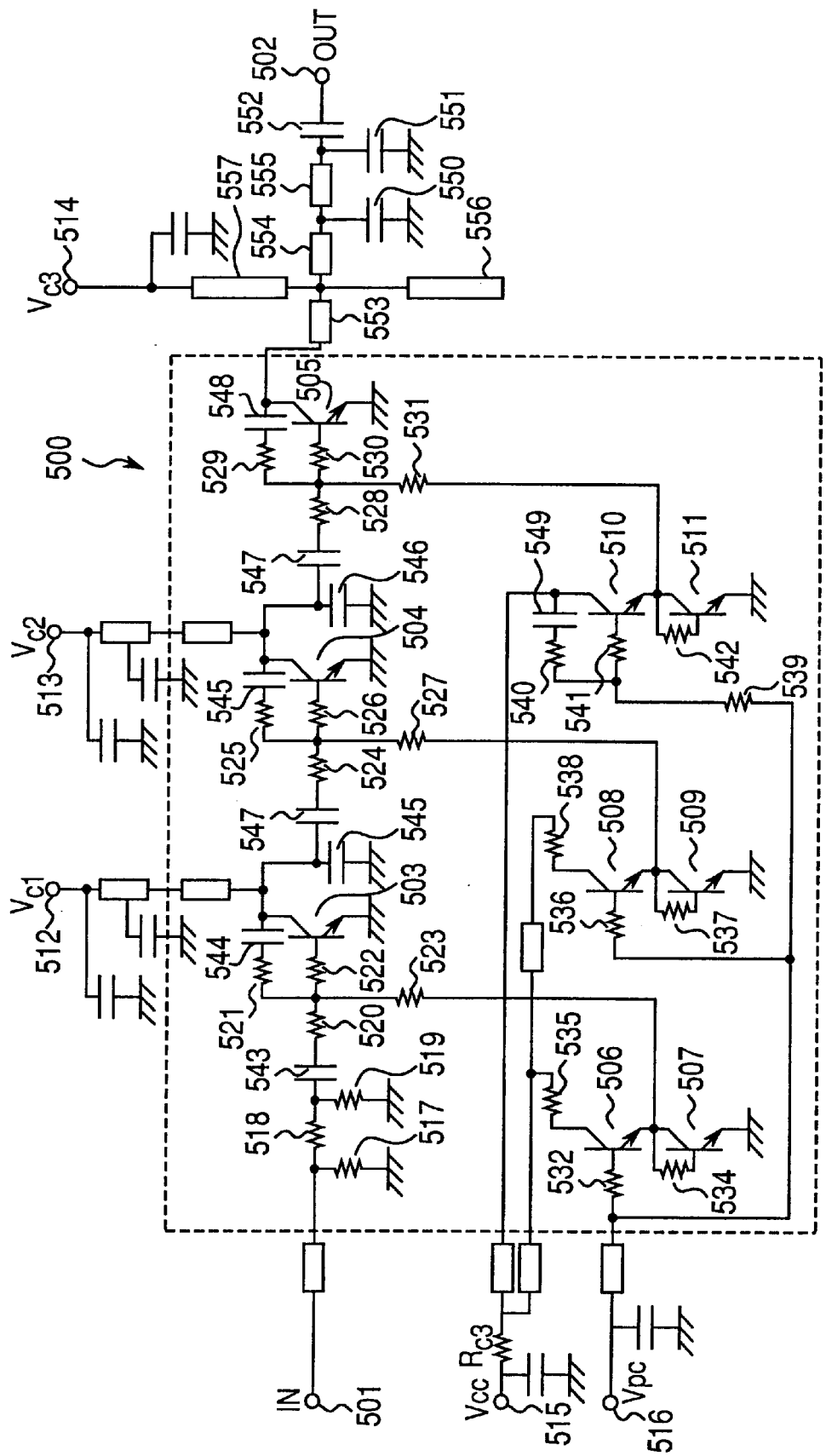
FIG. 10 is a circuit diagram of a conventional GSM power amplifier.
Figure 11:
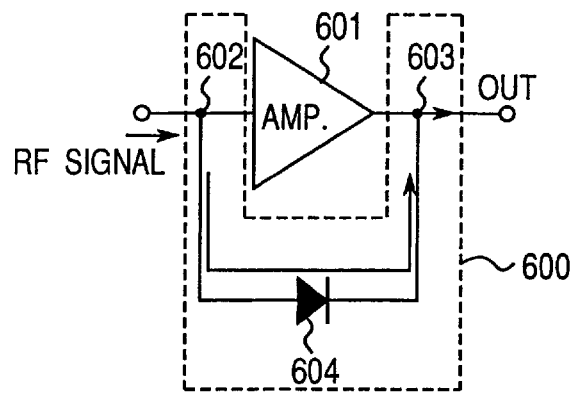
FIG. 11 is a circuit diagram of a feedback circuit connected between the input and output terminals of a conventional power amplifier as shown in FIG. 10.
Figure 12:
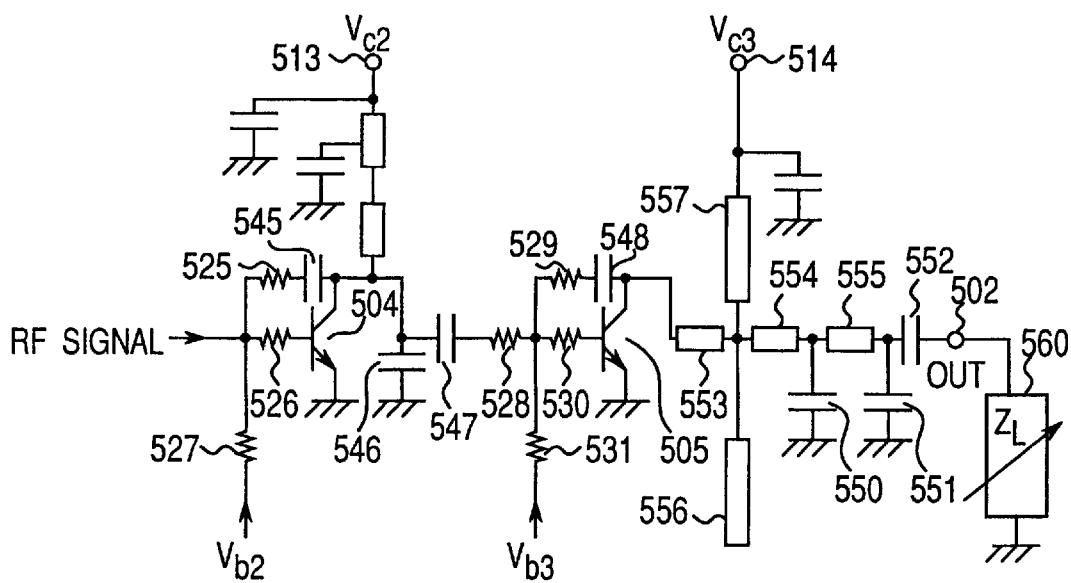
FIG. 12 is a circuit diagram of a variable load impedance circuit connected to the output terminal of the GSM power amplifier shown in FIG. 10.
Figure 13:
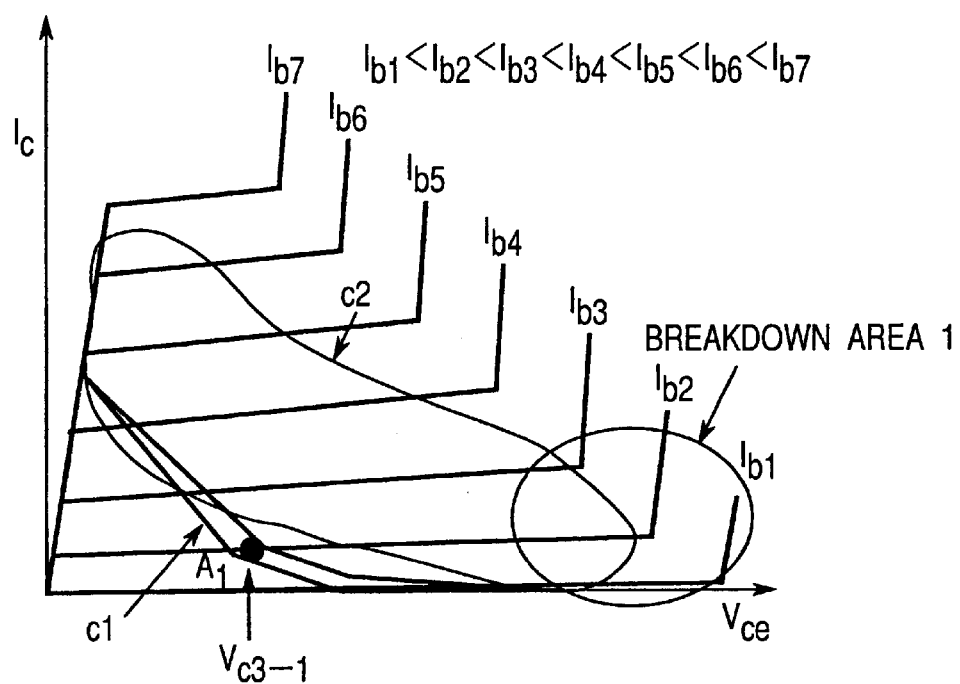
FIG. 13 is a graph of transistor Ic-Vce characteristics and load curves.
Figure 14:
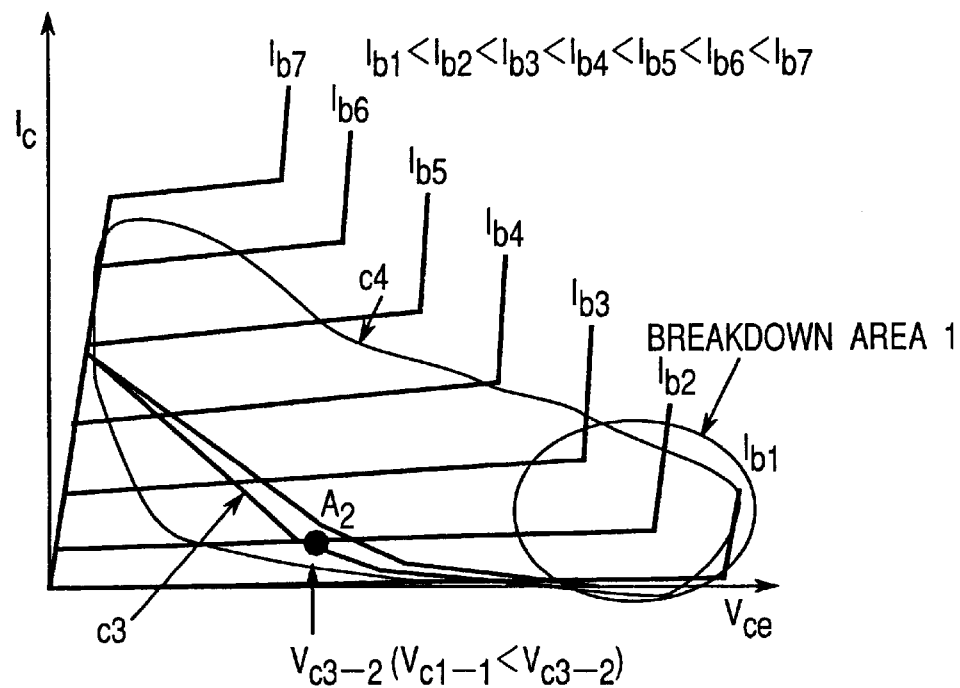
FIG. 14 is a graph of transistor Ic-Vce characteristics and load curves.

FIG. 9 is a circuit diagram of a protection circuit 180 according to a seventh preferred embodiment of the present invention used in the above-described power amplifier 500.

Note that FIG. 9 shows only the significant circuit elements in the area of the second and third stage transistors 504 and 505 in power amplifier 500.

As shown in FIG. 9, this protection circuit 180 comprises a first protection circuit identical to the protection circuit 100 shown in FIG. 1 connected between node 105 and node 107, and a second protection circuit connected between node 106 and node 107. This second protection circuit comprises a Vbe multiplier having resistors 181 and 182 and transistor 183, and a plurality of n transistors 184 to 185 diode connected in series to the Vbe multiplier.

In this example let us assume that the breakdown voltage of the last transistor 505 is 12 V. In addition, there are four transistors diode connected in series to the emitter of transistor 183. In this case the on voltage of the second protection circuit is $V_{f2}$, which is approximately $1.3 * 4+(R_{fb3}+R_{fb4})/R_{fb4} \times 1.3$ (V). The on voltage of the first protection circuit is $V_{fb1}$, or approximately $(R_{fb1}+R_{fb2})/R_{fb2} \times 1.3$ (V).

The on voltage of the second protection circuit is set higher than the on voltage of the first protection circuit. For example, if the on voltage of the first protection circuit is 8 V, the on voltage of the second protection circuit is set to 10 V. Thus comprised, the second protection circuit will not turn on unless the first protection circuit turns on. Therefore, when the power control voltage Vpc is 0 V, the collector current Ic3 of the last transistor 505 can be reliably set to 0 V.

When an overvoltage supply is applied or there a load impedance mismatch causing the peak collector voltage Vce of the load curve to rise, the first protection circuit begins functioning as a feedback circuit when the collector voltage Vce exceeds 8 V. If the collector voltage Vce then further exceeds 10 V, the second protection circuit also becomes active and begins functioning as a feedback circuit, thus achieving significant collector voltage limiting. This makes it possible to effectively prevent last transistor 505 breakdown as a result of peak collector voltage Vce exceeding the breakdown voltage.

By thus comprising a plurality of transistors 184 to 185 diode connected in series, the protection circuit 180 according to this preferred embodiment can further reduce parasitic capacitance compared with a protection circuit 100 according to the first embodiment, and can thus further reduce the effects of parasitic capacitance on the amplification ratio and output signal wave under normal operating voltage conditions.

It should also be noted that this protection circuit 180 occupies more chip area than does a protection circuit 100 as shown in FIG. 1 because of the plural transistors used to set the on voltage of the second protection circuit higher than the on voltage of the first protection circuit. However, compared with the use of an isolator to prevent last transistor 505 breakdown as previously described above, it is still possible by means of this protection circuit 180 to prevent breakdown of the last transistor 505 while also significantly reducing the overall circuit scale compared with use of the above-noted isolator.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A power amplifier comprising:
   a plurality of bipolar transistors having respective bases, collectors, and emitters and connected in multiple stages, including a first-stage transistor and an output last-stage transistor, for amplifying a signal; and
   a protection circuit connected between the collector and the base of at least the last-stage transistor, the protection circuit comprising a bipolar protection transistor having an emitter, a base, and a collector, the collector and the base being connected to each other, and supplying a feedback current to the base of the last-stage transistor when a voltage at least equal to a threshold voltage is applied between the collector and the emitter of the bipolar protection transistor.

2. The power amplifier according to claim 1, including first and second resistors wherein the bipolar protection transistor forms a Vbe multiplier together with the first and second resistors, the first resistor being connected between the collector and the base of the bipolar protection transistor and the second resistor being connected between the base and the emitter of the bipolar protection transistor.

3. A power amplifier comprising:
   a plurality of bipolar protection transistors connected in multiple stages, including a first-stage bipolar transistor and a last-stage bipolar transistor, for amplifying a signal, each of the bipolar transistors having a base, a collector, and an emitter, and
   a protection circuit connected between the collector and the base of at least the last-stage transistor and including a plurality of bipolar protection transistors connected in series, each of the bipolar protection transistors having a base, an emitter, and a collector, the base and collector of each bipolar protection transistor being connected to each other, and supplying a feedback current to the base of the last-stage transistor when a voltage at least equal to a threshold voltage is applied between opposite ends of the plurality of the bipolar protection transistors connected in series.

4. The power amplifier according to claim 3, including first and second resistors wherein at least one of the plurality of bipolar protection transistors forms a Vbe multiplier together with the first and second resistors, the first resistor being connected between the collector and the base of the at least one of the plurality of bipolar protection transistors and the second resistor being connected between the base and the emitter of the at least one of the plurality of bipolar protection transistors.

5. The power amplifier according to claim 2, further comprising a specific resistance connected between the collector of the bipolar protection transistor and the first resistor.

6. The power amplifier according to claim 2 further comprising at least one diode-connected transistor connected in series to one of the collector and the emitter of the bipolar protection transistor.

7. The power amplifier according to claim 1, wherein the collector of the bipolar protection transistor is connected to the collector of the last-stage transistor and the base of the bipolar protection transistor is connected to the base of the last-stage transistor.

8. The power amplifier according to claim 8, including a coupling capacitor wherein the base of the bipolar protection transistor is connected through the coupling capacitance to a transistor of a preceding stage.

9. A power amplifier comprising:
   a plurality of bipolar transistors connected in multiple stages, including a first-stage bipolar transistor and a last-stage bipolar transistor, for amplifying a signal, each of the bipolar transistors having a base, a collector, and an emitter;

a first protection circuit connected between the collector and the base of at least the last-stage transistor and supplying a feedback current to the base of the last-stage transistor when a voltage at least equal to an ON voltage of said first protection circuit is applied between opposite ends of the first protection circuit; and a second protection circuit connected between the collector and the base of at least the last-stage transistor and supplying a feedback current to the base of the last-stage transistor when a voltage at least equal to an ON voltage of the second protection circuit is applied between opposite ends of the second protection circuit, the ON voltage of the second protection circuit being higher than the ON voltage of the first protection circuit and lower than a breakdown voltage of the last-stage transistor.

10. The power amplifier according to claim 9, further comprising a capacitor connected between the first and second protection circuits.

11. The power according to claim 9, wherein the first and second protection circuits include respective bipolar protection transistors, each protection transistor having a base and a collector connected to each other.

12. The power amplifier according to claim 9, wherein the first and second protection circuits include respective Vbe multipliers, each Vbe multiplier having a bipolar protection transistor, a first resistor connected between a base and a collector of the bipolar protection transistor, and a second resistor connected between the base and an emitter of the bipolar protection transistor.

13. The power amplifier according to claim 9, wherein the second protection circuit includes a Vbe multiplier and a plurality of diode-connected transistors connected in series.

14. The power amplifier according to claim 2, further comprising a specific resistance connected between the emitter of the bipolar protection transistor and the second resistor.

* * * * *